US009786696B2

(12) United States Patent
Wang (10) Patent No.: US 9,786,696 B2
(45) Date of Patent: Oct. 10, 2017

(54) ARRAY SUBSTRATE, MANUFACTURING METHOD THEREOF AND DISPLAY DEVICE

(71) Applicants: BOE Technology Group Co., Ltd., Beijing (CN); HEFEI BOE Optoelectronics Technology Co., Ltd., Anhui (CN)

(72) Inventor: Sheng Wang, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 14/769,221

(22) PCT Filed: Jan. 4, 2015

(86) PCT No.: PCT/CN2015/070047
§ 371 (c)(1),
(2) Date: Aug. 20, 2015

(87) PCT Pub. No.: WO2016/045241
PCT Pub. Date: Mar. 31, 2016

(65) Prior Publication Data
US 2016/0268317 A1 Sep. 15, 2016

(30) Foreign Application Priority Data
Sep. 25, 2014 (CN) .......................... 2014 1 0498785

(51) Int. Cl.
*H01L 27/12* (2006.01)
*H01L 21/77* (2017.01)
(Continued)

(52) U.S. Cl.
CPC ........ *H01L 27/1255* (2013.01); *G02F 1/1362* (2013.01); *G02F 1/13439* (2013.01);
(Continued)

(58) Field of Classification Search
None
See application file for complete search history.

(56) References Cited

U.S. PATENT DOCUMENTS

| 5,432,108 A * | 7/1995 | Lee ......................... H01L 21/84 257/E21.703 |
| 9,040,344 B2 * | 5/2015 | Choi ................. H01L 21/02565 438/104 |

(Continued)

FOREIGN PATENT DOCUMENTS

| CN | 101887898 A | 11/2010 |
| CN | 102629577 A | 8/2012 |

(Continued)

OTHER PUBLICATIONS

Jun. 2, 2015—International Search Report and Written Opinion Appn PCT/CN2015/070047 with English Tran.
(Continued)

*Primary Examiner* — Andres Munoz
(74) *Attorney, Agent, or Firm* — Banner & Witcoff, Ltd.

(57) ABSTRACT

An array substrate, a manufacturing method thereof and a display device are provided. The array substrate comprises a base substrate, and a gate line and a common electrode provided in the same layer, a gate insulation layer, an active layer, a source electrode and a drain electrode provided in the same layer; and a pixel electrode provided in the same layer as the active layer, sequentially arranged on the base substrate.

5 Claims, 4 Drawing Sheets (51) Int. Cl.
*G02F 1/1335* (2006.01)
*G02F 1/1343* (2006.01)
*G02F 1/1362* (2006.01)
*H01L 29/24* (2006.01)
*H01L 29/786* (2006.01)

(52) U.S. Cl.
CPC .. *G02F 1/133514* (2013.01); *G02F 1/134309* (2013.01); *G02F 1/136286* (2013.01); *H01L 21/77* (2013.01); *H01L 27/12* (2013.01); *H01L 27/124* (2013.01); *H01L 27/1225* (2013.01); *H01L 27/1288* (2013.01); *H01L 29/24* (2013.01); *H01L 29/7869* (2013.01); *G02F 2001/136218* (2013.01); *G02F 2001/136231* (2013.01); *G02F 2201/123* (2013.01)

(56) References Cited

U.S. PATENT DOCUMENTS

| | | | |
|---|---|---|---|
| 2004/0027525 A1* | 2/2004 | Itakura | G02F 1/134363 349/141 |
| 2004/0125280 A1* | 7/2004 | Kim | G02F 1/13439 349/110 |
| 2011/0017989 A1* | 1/2011 | Chen | H01L 27/1225 257/43 |
| 2011/0085121 A1 | 4/2011 | Jeon et al. | |
| 2012/0181557 A1* | 7/2012 | Kim | H01L 27/1259 257/98 |
| 2015/0162361 A1* | 6/2015 | Wang | H01L 27/1225 257/43 |
| 2016/0027818 A1* | 1/2016 | Yoo | G02F 1/136286 257/43 |

FOREIGN PATENT DOCUMENTS

| | | | | |
|---|---|---|---|---|
| CN | 102790012 A | * | 11/2012 | ....... H01L 21/02565 |
| CN | 102810558 A | | 12/2012 | |
| CN | 103077944 A | | 5/2013 | |
| CN | 103984170 A | | 8/2014 | |

OTHER PUBLICATIONS

Sep. 12, 2016—(CN)—First Office Action Appn 201410498785.X with English Tran.

* cited by examiner

ARRAY SUBSTRATE, MANUFACTURING METHOD THEREOF AND DISPLAY DEVICE

The application is a U.S. National Phase Entry of International Application No. PCT/CN2015/070047 filed on Jan. 4, 2015, designating the United States of America and claiming priority to Chinese Patent Application No. 201410498785.X filed on Sep. 25, 2014. The present application claims priority to and the benefit of the above-identified applications and the above-identified applications are incorporated by reference herein in their entirety.

TECHNICAL FIELD

Embodiments of the present disclosure relate to an array substrate, a manufacturing method thereof and a display device.

BACKGROUND

A liquid crystal display is a common display device, which has the advantages of being thin and low power consumption and is widely used in many technology fields such as display, communication, multimedia and so on. The liquid crystal display comprises an array substrate and other structures.

SUMMARY

Embodiments of the present disclosure provide an array substrate, comprising: a base substrate, and comprising sequentially disposed on the base substrate, a gate line and a common electrode which are disposed in the same layer, a gate insulation layer, an active layer, a data line, a source electrode and a drain electrode which are disposed in the same layer successively arranged on the base substrate; and a pixel electrode, which is disposed in the same layer as the active layer.

In one example, the drain electrode covers one end of the active layer adjacent to the pixel electrode and one end of the pixel electrode adjacent to the active layer and is filled between the active layer and the pixel electrode.

In one example, the active layer comprises a metal-oxide semiconductor, and the pixel electrode is formed from the metal-oxide semiconductor through the metallization process.

In one example, material of the metal-oxide semiconductor for forming the pixel electrode is the same as that of the metal-oxide semiconductor included in the active layer.

In one example, the active layer includes ohmic contact regions and a channel region between the ohmic contact regions.

In one example, the array substrate further comprises an etching stop structure disposed on the channel region.

In one example, the active layer comprises two of the ohmic contact regions, the source electrode covers one of the ohmic contact regions, and the drain electrode covers the other of the ohmic contact regions and the end of the pixel electrode adjacent to the active layer and is filled in between the active layer and the pixel electrode.

In one example, the pixel electrode and the ohmic contact layer adjacent to the pixel electrode side are separated with certain intervals, and the drain electrode is filled between the intervals.

In one example, the common electrode comprises a portion parallel to the data line and a portion vertical to the data line.

In one example, the array substrate further comprises a passivation layer disposed on the data lines, the source electrode and the drain electrode, which are provided in the same layer, and a transparent electrode disposed on the passivation layer, and the transparent electrode is arranged above the data line and the common electrode.

In one example, the transparent electrode comprises three mutually independent transparent conductive portions, wherein the first transparent conductive portion is connected to the gate line through a via, the second transparent conductive portion is connected to the common electrode through a via, and the third transparent conductive portion is connected to the data line through a via.

Embodiments of the present disclosure further provide a display device comprising the array substrate as described in any implementation above.

Embodiments of the present disclosure further provide a method for manufacturing an array substrate, the method comprising: forming a pattern including a gate line and a common electrode on a base substrate; forming a gate comprising layer on the pattern of the gate line and the common electrode; forming a pattern comprising an active layer and a pixel electrode on the gate insulation layer, the pixel electrode and the active layer being disposed in the same layer; and forming a pattern comprising a data line, a source electrode and a drain electrode.

In one example of the method, a metal-oxide semiconductor layer is deposited on the gate insulation layer, and a pattern comprising the active layer and the pixel electrode pre-structure is formed through a patterning process; and the pixel electrode is formed by performing a metallization process on the pixel electrode pre-structure.

In one example of the method, the metallization process comprises processing the metal-oxide semiconductor in the pixel electrode pre-structure for 30-120 min in the reducing atmosphere at 100-300.

In one example of the method, the gas used in the reducing atmosphere comprises hydrogen or plasma containing hydrogen.

In one example of the method, the method further comprises forming an etching stop layer on the metal-oxide semiconductor layer; and coating a layer of photoresist on the etching stop layer.

In one example of the method, a photoresist completely reserved region, a photoresist partly reserved region and a photoresist completely removed region are formed through the patterning process, the photoresist completely reserved regions corresponding to the region where a channel region in the active layer is disposed, the photoresist partly reserved region corresponding to the regions where ohmic contact regions in the active layer and the pixel electrode are disposed, the photoresist completely removed region corresponding to rest regions; regions of the etching stop layer and the metal-oxide semiconductor layer not covered by the photoresist are removed through etching; the photoresist partly reserved region is removed through an ashing process, and meanwhile the thicknesses of the photoresist completely reserved region is reduced; the etching stop layer exposed after removing the photoresist partly reserved regions is removed; and the photoresist is peeled off so as to form a pattern comprising the active layer, the pixel electrode pre-structure and the etching stop structure, the etching stop structure be disposed on channel regions in the active layer.

In one example of the method, at the same time with the pixel electrode being formed by performing a metallization process on the pixel electrode pre-structure, an ohmic contact region is formed by performing a metallization process on a region in the active layer for forming the ohmic contact regions, so as to form the active layer comprising the ohmic contact region and the channel region.

In one example of the method, the manufacturing method of the array substrate further comprises: forming a passivation layer on the pattern of the data line, the source electrode and the drain electrode; and forming a pattern comprising a transparent electrode on the passivation layer, the transparent electrode is disposed above the data line and the common electrode.

BRIEF DESCRIPTION OF THE DRAWINGS

In order to make those skilled in the art more clearly understand the present disclosure, embodiments of the present disclosure will be described hereinafter in detail in combination with the drawings, in which.

DETAILED DESCRIPTION

The technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, technical terms or scientific terms as used herein should be construed as having general meanings which should be understood by those ordinary skilled in the art. Terms of "first", "second" and the like used in the description and the claims of the present application are not intended to indicate sequences, amounts or degree of importance, but are only for purpose of distinguishing various components. Likewise, terms of "one", "a" and "the" are not intended to limit the number, but indicate that there is at least one item. Words of "including" or "comprising" and the like mean that an element or an article before them contains an element/elements or an article/articles listed thereafter, while not excluding other elements or articles. Terms of "upper", "lower" and etc. are only intended to indicate relative positional relationship which may be correspondingly changed after an absolute position of the described object is changed.

Figure 1:
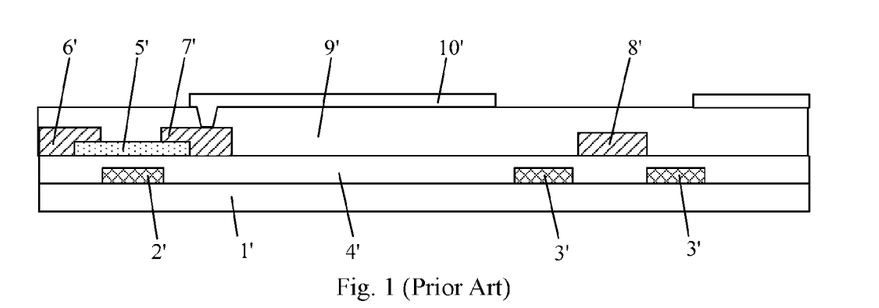
FIG. 1 is a sectional schematic diagram of an array substrate.

A liquid crystal display comprises an array substrate, an opposite substrate and a liquid crystal layer therebetween. The structure of an array substrate is illustrated in FIG. 1, the array substrate comprises a base substrate 1' and a gate electrode 2' and a common electrode 3' disposed in the same layer, a gate insulation layer 4', an active layer 5', a source electrode 6', a drain electrode 7' and data lines 8' which are disposed in the same layer, a passivation layer 9', and a pixel electrode 10', sequentially disposed on the base substrate 1'. The pixel electrode 10', the passivation layer 9', the gate insulation layer 4' and the common electrode 3' constitute a storage capacitor which serves to maintain stability of an image displayed on the liquid crystal display. The inventor found that the capacitance of the storage capacitor of the array substrate in this technology is small, which is adverse e to the stability of the displayed image.

Exemplary embodiments of the present disclosure are described below.

The First Embodiment

Figure 2:
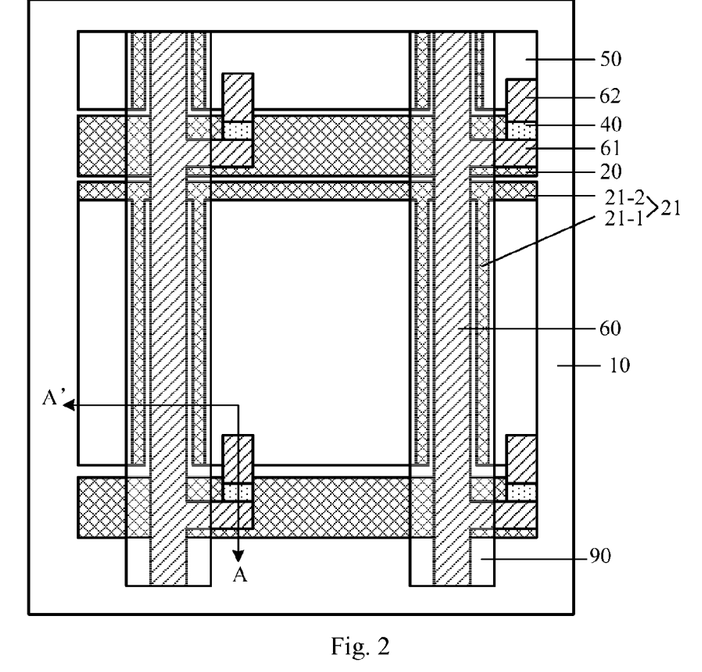
FIG. 2 is a planar schematic diagram of the array substrate according to an embodiment of the present disclosure.
Figure 3:
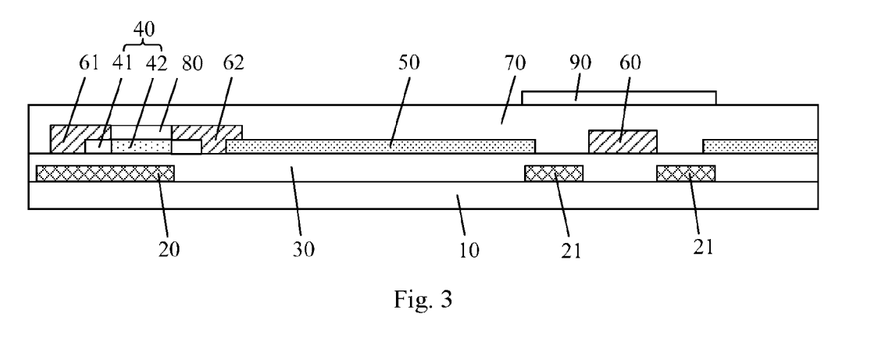
FIG. 3 is a sectional schematic diagram of FIG. 2 taken along the A-A' direction in an embodiment of the present disclosure.

As illustrated in FIGS. 2 and 3, the array substrate of the embodiment of the present disclosure comprises: a base substrate 10; and a gate line 20 and a common electrode 21 disposed in the same layer, a gate insulation layer 30 (the gate insulation layer 30 is not illustrated in FIG. 2), an active layer 40, and a data line 60, a source electrode 61 and a drain electrode 62 disposed in the same layer sequentially disposed on the base substrate 10, and the array substrate further comprises a pixel electrode 50, the pixel electrode 50 being disposed in the same layer as the active layer 40. At this time, the storage capacitor is a capacitor constituted by the pixel electrode 50, the gate insulation layer 30 and the common electrode 21; while the storage capacitor in FIG. 1 is the capacitor constituted by the pixel electrode, the passivation layer, the gate insulation layer and the common electrode, therefore, compared with it, the insulation layer in the storage capacitor in the embodiment of the present disclosure is just the gate insulation layer 30, which makes the storage capacitor formed by the pixel electrode 50, gate insulation layer 30 and the common electrode 21 have relatively larger capacitance, thus it can effectively improve the display effect of the display device.

Furthermore, since the pixel electrode 50 and the active layer 40 are disposed in the same layer, the drain electrode 62 covers the end of the active layer 40 adjacent to the pixel electrode 50 and the end of the pixel electrode 50 adjacent to the active layer 40 and is filled between the active layer 40 and the pixel electrode 50, so as to realize the connection between the drain electrode 62 and the pixel electrode 50.

As illustrated in FIG. 2, the common electrode 21 in the embodiment of the present disclosure includes a portion 21-1 parallel to the data line 60 and a portion 21-2 perpendicular to the data line 60, such a design can effectively reduce a resistance of the common electrode 21 and improve the performance of the array substrate.

It should be noted that, the array substrate in the embodiment of the present disclosure has not provided a gate electrode individually thereon, but the active layer 40 is disposed above the gate lines 20, and a signals on the gate line 20 can realize control of the active layer 40, which in turn controls whether turning on the source electrode and the drain electrode or not. A gate electrode can also be individually provided on the array substrate by those skilled in the art, which is not limited by the present disclosure.

For example, due to higher mobility of the metal-oxide semiconductor, the active layer 40 in the embodiment of the present disclosure includes the metal-oxide semiconductor. To simplify a manufacturing method of the array substrate, the pixel electrode 50 in the embodiment of the present disclosure is the structure formed from the metal-oxide semiconductor by means of metallization process, and material of the metal-oxide semiconductor for forming the pixel electrode 50 is the same as that of the metal-oxide semiconductor serving as the active layer 40. Exemplarily, the above mentioned metal-oxide semiconductor can one or more of InGaZnO, InGaO, ITZO, and AlZnO.

For example, as illustrated in FIG. 3, the active layer 40 includes ohmic contact regions 41 and a channel region 42 for serving as a channel between the ohmic contact regions 41. The ohmic contact regions 41 can be formed by performing metallization process on the regions in the active layer 40 for serving as ohmic contact regions 41. The array substrate can further include an etching stop structure 80 located on the channel region 42. The etching stop structure 80 can protect the metal-oxide semiconductor of the channel region 42 from being metallized during the metallization process.

Exemplarily, when the active layer 40 includes two ohmic contact regions 41, the source electrode 61 covers one of the ohmic contact regions 41, and the drain electrode 62 covers the other of the ohmic contact regions 41 and the end of the pixel electrode 50 adjacent to the active layer 40, and the drain electrode 62 is located between the active layer 40 and the pixel electrode 50, so as to realize connection between the drain electrode 62 and the pixel electrode 50.

Furthermore, as illustrated in FIGS. 2 and 3, the array substrate in the embodiment of the present disclosure can further comprise a passivation layer 70 located on the data lines 60, the source electrode 61 and the drain electrode 62, which are disposed in the same layer and a transparent electrode 90 disposed on the passivation layer 70. The transparent electrode 90 is arranged above the data lines 60 and the common electrode 21. On one hand, the coupling capacitance formed between the data lines 60 and the pixel electrode 50 can be reduced, thus reducing the crosstalk between the data lines 60 and pixel electrode 50. For example, the transparent electrode 90 includes a plurality of mutually independent transparent conductive portions, each of which is connected to the wires below through a via. Exemplarily, the transparent electrode 90 comprises three mutually independent transparent conductive portions, wherein the first transparent conductive portion is connected to the gate line 20 through a via so as to supply the gate lines with gate-drive signals, the second transparent conductive portion is connected to the common electrode 21 through a via so as to supply the common electrode 21 with a common electrode signal, and the third transparent conductive portion is connected to the data line 60 through a via so as to supply the data line 60 with data signals.

On the other hand, since the pixel electrode 50 is covered by the passivation layer 70 and the transparent electrode 90, where there is some metal foreign matter within the liquid crystal cell, the metal foreign matter does not cause the pixel electrode 50 and the common electrode on the color film substrate to be turned on directly, thereby not affecting the display effect of the display device.

The embodiment of the present disclosure provides an array substrate comprising: a base substrate; and a gate line and a common electrode which are disposed in the same layer, a gate insulation layer, an active layer, and a data line, a source electrode and a drain electrode which are disposed in the same layer, sequentially arranged on the base substrate. The array substrate further comprises a pixel electrode, the pixel electrode and the active layer being disposed in the same layer. The storage capacitor on the array substrate as shown in FIG. 1 is the capacitance formed by the pixel electrode, the passivation layer, the gate insulation layer and the common electrode, whereas in the embodiment of the present disclosure only the gate insulation layer is provided between the pixel electrode and the common electrode, the storage capacitance is the capacitance formed by the pixel electrode, the gate insulation layer and the common electrode, thus it can effectively increase storage capacitance and improve the display effect of the display device.

Furthermore, an embodiment of the present disclosure further provides a display device comprising the array substrate as described in any implementation above. For example, the array substrate and the opposite substrate are opposed to each other and cell-assembled to form a liquid crystal cell with the liquid crystal material filled therein. The opposite substrate is, for example, a color film substrate. The pixel electrode of each pixel unit of the array substrate is configured to apply an electric field to control the degree of the rotation of the liquid crystal material, thereby performing the display operation. In some examples, the liquid crystal display device further includes a backlight source for providing the array substrate with backlight.

The display device can be a liquid crystal display panel, electronic paper, an organic light-emitting display panel, a mobile phone, a tablet computer, a TV set, a monitor, a notebook computer, a digital photo frame, a navigator, a watch or any other product or component with display function.

The Second Embodiment

Figure 4:
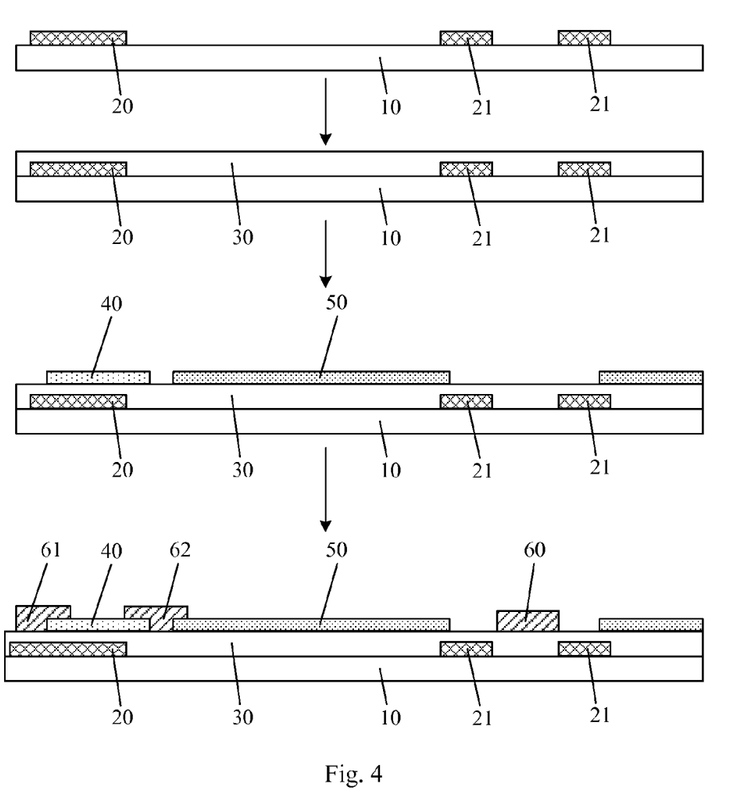
FIG. 4 is a schematic diagram of the manufacturing process of the array substrate in embodiments of the present disclosure.
Figure 5:
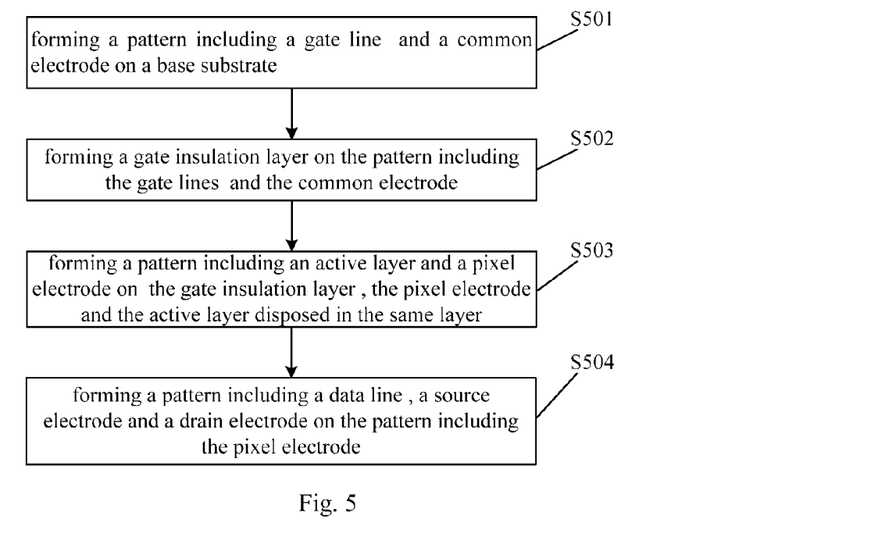
FIG. 5 is a flowchart of manufacturing the array substrate in embodiments of the present disclosure.

The embodiment of the present disclosure provides a method for manufacturing an array substrate used for manufacturing the array substrate as described in the first embodiment. FIG. 4 illustrates the manufacturing process for the array substrate which comprises each step as illustrated in FIG. 5.

Step S501: forming a pattern including a gate line 20 and a common electrode 21 on a base substrate 10.

First, a metal layer for gate electrode is deposited on the base substrate 10; and the pattern including a gate line 20 and a common electrode 21 is formed through a patterning process. It should be noted that, if there is no special emphasis, the patterning process in this application can include coating the photoresist, and masking with a mask having corresponding patterns, exposing, developing, etching and peeling off the photoresist.

It should be noted that, the array substrate in the embodiment of the present disclosure does not provide a gate electrode individually thereon, the gate electrode can further be provided on the array substrate by those skilled at the same time as the gate line 20, which is not limited in the present disclosure.

Step S502: forming a gate insulation layer 30 on the base substrate 10 with the pattern including the gate lines 20 and the common electrode 21 formed thereon.

Step S503: forming a pattern including an active layer 40 and a pixel electrode 50 on the base substrate 10 with the gate insulation layer 30 formed thereon, the pixel electrode 50 and the active layer 40 being disposed in the same layer.

First, a metal-oxide semiconductor layer is deposited on the base substrate 10 with the gate insulation layer 30 formed thereon, and a pattern including the active layer 40 and the pixel electrode pre-structure is formed through a patterning process.

Then, the pixel electrode 50 is formed by performing a metallization process on the pixel electrode pre-structure. For example, the metallization process comprises processing the metal-oxide semiconductor of the pixel electrode pre-structure for 30-120 min in a reducing atmosphere at 100-300° C., the reducing atmosphere comprises hydrogen or plasma containing hydrogen. During the metallization process, hydrogen is doped into the metal-oxide semiconductor, which converts the metal-oxide semiconductor into a conductor.

Step S504: forming a pattern including a data line 60, a source electrode 61 and a drain electrode 62 on the base substrate 10 with the pattern including the pixel electrode 50 formed thereon.

First, a metal layer for data line is deposited on the base substrate 10 with the pattern including the pixel electrode 50 formed thereon; and a pattern including a data line 60, a source electrode 61 and a drain electrode 62 is formed through a patterning process.

Figure 6:
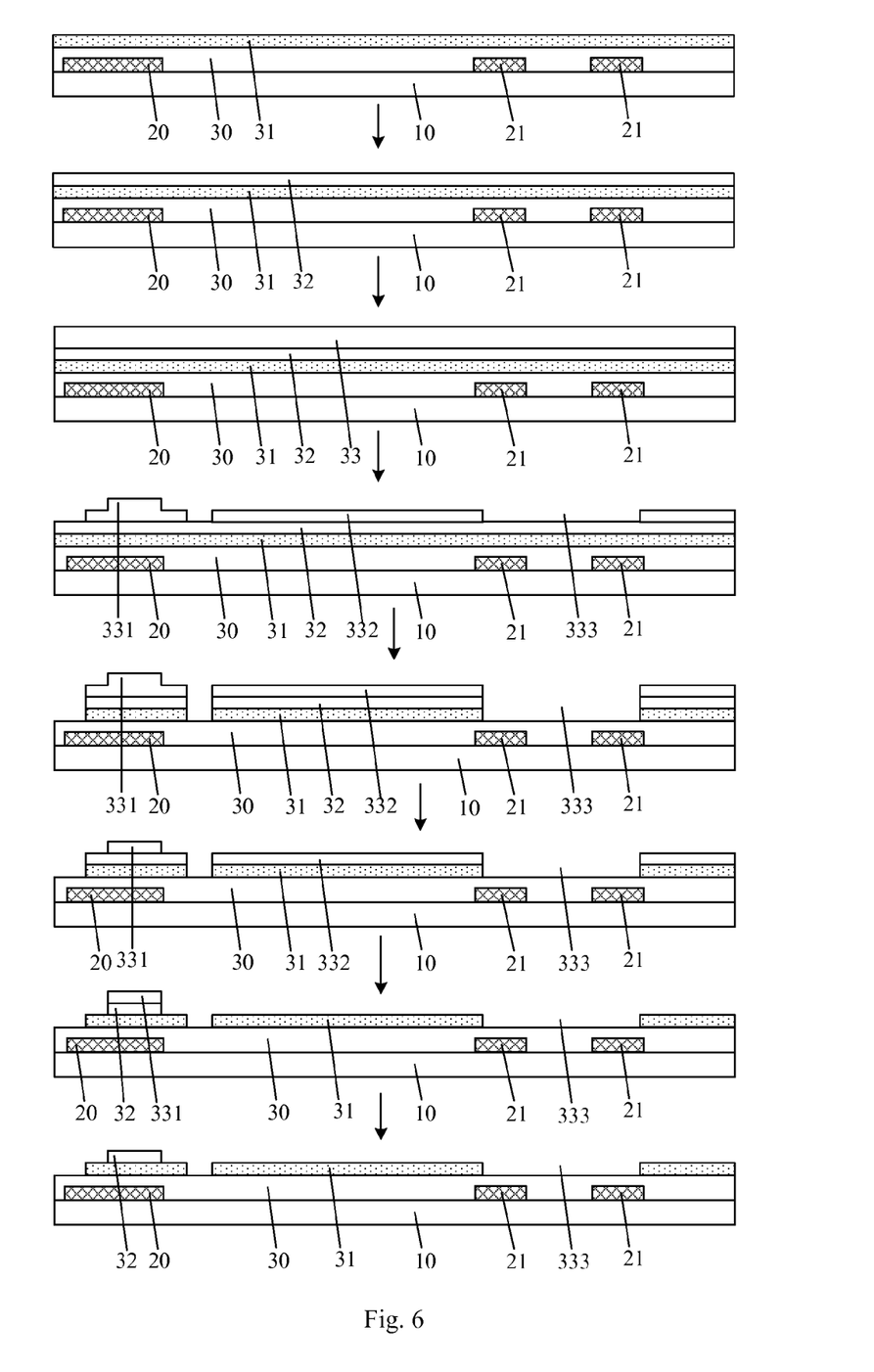
FIG. 6 is a schematic diagram of the manufacturing process of forming a pattern including the active layer and the pixel electrode disposed in the same layer on the array substrate with a gate insulation layer formed thereon in an embodiment of the present disclosure.
Figure 7:
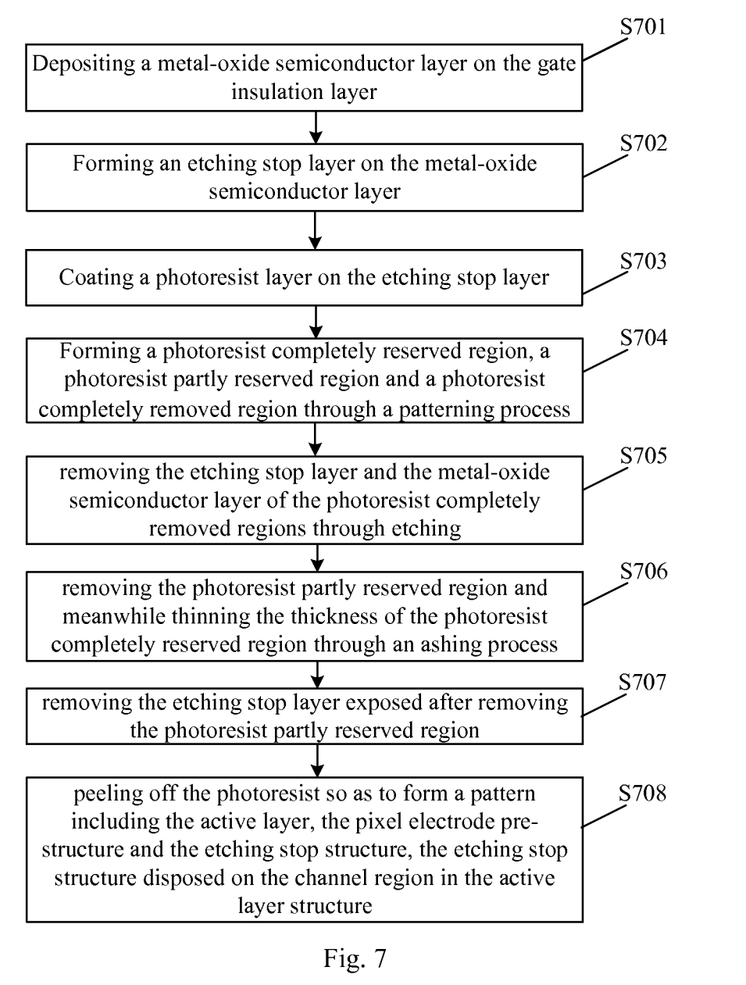
FIG. 7 is a detailed flowchart of forming a pattern including the active layer and the pixel electrode disposed in the same layer on the array substrate with a gate insulation layer formed thereon in an embodiment of the present disclosure.

For example, FIG. 6 illustrates the manufacturing process of step S503 in which the metal-oxide semiconductor layer is deposited on the base substrate 10 with the gate insulation layer 30 formed thereon and the pattern including the active layer 40 and the pixel electrode pre-structure is formed through a patterning process, the manufacturing process including, for example, the steps as shown in FIG. 7.

Step S701: depositing a metal-oxide semiconductor layer 31 on the base substrate 10 with the gate insulation layer 30 formed thereon.

Step S702: forming an etching stop layer 32 on the base substrate 10 with the metal-oxide semiconductor layer 31 formed thereon.

Step S703: coating a photoresist layer 33 on the base substrate 10 with the etching stop layer 32 formed thereon.

Step S704: a photoresist completely reserved region 331, a photoresist partly reserved region 332 and a photoresist completely removed region 333 are formed through a patterning process.

The photoresist completely reserved region 331 corresponds to an region where a channel region in the active layer for serving as channels is located, the photoresist partly reserved region 332 corresponds to the regions where ohmic contact regions in the active layer and the pixel electrode are located, and the photoresist completely removed region 333 correspond to rest regions.

In the patterning process it is preferred to use a grayscale mask which includes a completely opaque region, a half-transmissive regions and a completely transmissive region. The completely opaque region corresponds to the region where a channel region in the active layer for serving as a channel is located, the photoresist 33 is completely reserved after developing, to form the photoresist completely reserved region 331; the half-transmissive region corresponds to the region where ohmic contact regions in the active layer and the pixel electrode are located, the photoresist 33 is partly reserved after developing, to form the photoresist partly reserved region 332; and the completely transmissive region corresponds to rest regions, the photoresist 33 is completely removed after developing, to form the photoresist completely removed region 333.

Step S705: removing the etching stop layer 32 and the metal-oxide semiconductor layer 31 of the photoresist completely removed regions 333 through etching.

Step S706: removing part of the photoresist to a form partly reserved region 332 and meanwhile thinning the thickness of the photoresist completely reserved region 331 through an ashing process.

Step S707: removing the etching stop layer 32 which is exposed after removing the photoresist partly reserved region 332.

Step S708: peeling off the photoresist 33 so as to form a pattern including the active layer, the pixel electrode pre-structure and the etching stop structure. The etching stop structure is locating above a channel region in the active layer for serving as a channel.

While forming the pixel electrode being through performing the metallization process on the pixel electrode pre-structure, the ohmic contact regions are formed by performing a metallization process on the regions where the ohmic contact regions in the active layer are located. The channel region is covered with the etching stop layer, making the channel region not subject to the metallization process, so as to form the active layer including the ohmic contact regions and the channel region.

Furthermore, the manufacturing method of the array substrate further comprises: forming a passivation layer 70 on the base substrate 10 with the pattern including the data line 60, the source electrode 61 and the drain electrode 62 formed thereon; and forming a pattern including a transparent electrode 90 on the base substrate 10 with the passivation layer 70 formed thereon. The transparent electrode 90 is disposed above the data line and the common electrode 21, thus the electric field between the data line 60 and the pixel electrode 50 is shielded, which can effectively reduce crosstalk between the data line 60 and the pixel electrode 50. For example, the transparent electrode 90 can also be connected to other wire layers through vias, to transmit external signals to the respective wire layers.

Furthermore, a cleaning step can also be comprised before the formation of each of the film layers on the array substrate, in order to improve the quality of the array substrate.

The embodiment of the present disclosure provides a manufacturing method of an array substrate comprising: forming a pattern including a gate line and a common electrode on a base substrate; forming a gate insulation layer; forming a pattern including an active layer, forming a pattern including a pixel electrode, the pixel electrode and the active layer being disposed in the same layer; and forming a pattern including a data line, a source electrode and a drain electrode. The storage capacitance on the array substrate as shown in FIG. 1 is the capacitance formed by the pixel electrode, the passivation layer, the gate insulation layer and the common electrode, whereas only the gate insulation layer is provided between the pixel electrode and the common electrode on the array substrate manufactured by the manufacturing method of the embodiment of the present disclosure, i.e., the storage capacitance is the capacitance formed by the pixel electrode, the gate insulation layer and the common electrode, thus it can effectively increase storage capacitance and improve the display effect of the display device.

What are described above is related to the illustrative embodiments of the disclosure only and not limitative to the scope of the disclosure; the scopes of the disclosure are defined by the accompanying claims.

This disclosure claims the benefit of Chinese patent application No. 201410498785.X, filed Sep. 25, 2014, "Array Substrate, Manufacturing Method Thereof and Display Device", the disclosure of which is hereby incorporated herein entirely by reference.

The invention claimed is:

1. A manufacturing method of an array substrate, comprising:

forming a pattern comprising a gate line and a common electrode on a base substrate;

forming a gate insulation layer on the pattern of the gate line and the common electrode;

forming a pattern comprising an active layer and a pixel electrode on the gate insulation layer, the pixel electrode and the active layer provided on the same layer, wherein a metal-oxide semiconductor layer is deposited on the gate insulation layer, and a pattern comprising the active layer and a pixel electrode pre-structure is formed through a patterning process and the pixel electrode is formed by performing a metallization process on the pixel electrode pre-structure;

forming an etching stop layer on the metal-oxide semiconductor layer;

coating a photoresist layer on the etching stop layer;

forming a photoresist completely reserved region, a photoresist partly reserved region and a photoresist completely removed region through a patterning process, the photoresist completely reserved region corresponding to a region where a channel region in the active layer is located, the photoresist partly reserved region corresponding to regions where ohmic contact regions in the active layer and the pixel electrode are located, and the photoresist completely removed region corresponding to regions other than the photoresist completely reserved region and the photoresist partly reserved region;

removing regions of the etching stop layer and the metal-oxide semiconductor layer which are not covered by the photoresist layer;

removing the photoresist partly reserved region, and simultaneously thinning a thickness of the photoresist completely reserved region;

removing the etching stop layer exposed after removing the photoresist partly reserved region; and peeling off the photoresist layer so as to form a pattern comprising the active layer, the pixel electrode pre-structure and the etching stop layer, the etching stop layer being located on the channel region in the active layer; and forming a pattern comprising a data line, a source electrode and a drain electrode.

2. The manufacturing method of the array substrate according to claim 1, wherein the metallization process comprises processing the metal-oxide semiconductor layer in the pixel electrode pre-structure for 30-120 min in a reducing atmosphere at a temperature of 100° C.-300° C.

3. The manufacturing method of the array substrate according to claim 2, wherein a gas used in the reducing atmosphere comprises hydrogen or plasmas containing hydrogen.

4. The manufacturing method of the array substrate according to claim 1, wherein the ohmic contact regions are formed through performing a metallization process on the region in the active layer for forming the ohmic contact regions when forming the pixel electrode through performing a metallization process on the pixel electrode pre-structure, wherein the channel region is not subject to the metallization process so as to form the active layer comprising the ohmic contact regions and the channel region.

5. The manufacturing method of the array substrate according to claim 1, further comprising:

forming a passivation layer on the data line, the source electrode and the drain electrode; and forming a transparent electrode on the passivation layer, the transparent electrode arranged above the data line and the common electrode.

* * * * *